US009065079B2

(12) United States Patent
Liu et al.

(10) Patent No.: US 9,065,079 B2
(45) Date of Patent: Jun. 23, 2015

(54) FABRICATION METHOD OF A PIXEL STRUCTURE OF AN ELECTROLUMINESCENT DISPLAY PANEL

(71) Applicant: AU Optronics Corp., Hsin-Chu (TW)

(72) Inventors: Meng-Yu Liu, Hsin-Chu (TW); Chih-Che Liu, Hsin-Chu (TW); Shih-Feng Hsu, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/452,547

(22) Filed: Aug. 6, 2014

(65) Prior Publication Data
US 2014/0342483 A1    Nov. 20, 2014

Related U.S. Application Data

(62) Division of application No. 13/674,088, filed on Nov. 11, 2012, now Pat. No. 8,847,857.

(30) Foreign Application Priority Data

Dec. 8, 2011    (TW) .............................. 100145252 A (51) Int. Cl.
*G09G 3/30* (2006.01)
*H01L 51/56* (2006.01)
(Continued)

(52) U.S. Cl.
CPC .......... *H01L 51/56* (2013.01); *G09G 3/30* (2013.01); *Y10T 29/49002* (2015.01); *H01L 51/5088* (2013.01); *H01L 51/5265* (2013.01); *H01L 27/3206* (2013.01); *H01L 2251/56* (2013.01)

(58) Field of Classification Search
CPC ............... G09G 2300/0842; G09G 3/3233; G09G 2320/043; G09G 3/30; H01L 51/56; H01L 51/5265; H01L 27/3206; H01L 2251/5088; Y01T 29/49002

USPC ......................................... 345/76, 77, 80, 84
See application file for complete search history.

(56) References Cited

U.S. PATENT DOCUMENTS 5,917,280 A    6/1999    Burrows
7,466,294 B2    12/2008    Yamazaki
(Continued)

FOREIGN PATENT DOCUMENTS

| CN | 101425529 A | 5/2009 |
| EP | 2 267 778 A2 | 12/2010 |
| TW | 201129244 | 8/2011 |

OTHER PUBLICATIONS

Huang, "The study of full color display based on white polymer light-emitting devices combined with color filters", Jan. 2008.
(Continued)

*Primary Examiner* — Adam R Giesy
(74) *Attorney, Agent, or Firm* — Winston Hsu; Scott Margo (57) ABSTRACT

A fabrication method of a pixel structure of an electroluminescent display panel includes the following steps. A substrate is provided. A first anode, a second anode and a third anode are formed in a first sub-pixel region, a second sub-pixel region and a third sub-pixel region respectively. A first organic light-emitting layer is formed in the first sub-pixel region by using a first fine metal mask. A second organic light-emitting layer is formed in the second sub-pixel region and the third sub-pixel region by using a second fine metal mask. A first cathode, a second cathode and a third cathode are formed in the first sub-pixel region, the second sub-pixel region, and the third sub-pixel region, respectively. The first micro cavity in the first sub-pixel region, the second micro cavity in the second sub-pixel region and the third micro cavity have different cavity lengths.

6 Claims, 10 Drawing Sheets

(51) Int. Cl.
  *H01L 51/52* (2006.01)
  *H01L 27/32* (2006.01)
  *H01L 51/50* (2006.01)

(56) References Cited

U.S. PATENT DOCUMENTS 7,872,412 B2  1/2011  Chan

2011/0180825 A1  7/2011  Lee et al.
2012/0326180 A1*  12/2012  Ohe et al. .................. 257/88

OTHER PUBLICATIONS

Ma, "Study Forward the Fabrication of High-Efficiency White Organic Light-Emitting Diodes", Jul. 2006.

* cited by examiner

FABRICATION METHOD OF A PIXEL STRUCTURE OF AN ELECTROLUMINESCENT DISPLAY PANEL

CROSS REFERENCE TO RELATED APPLICATIONS

This application is a divisional of application Ser. No. 13/674,088 filed Nov. 11, 2012, now allowed, which is incorporated by reference herein in its entirety.

BACKGROUND OF THE INVENTION

1. Field of the Invention

The present invention relates to a pixel structure of an electroluminescent display panel, and a fabrication method thereof, and more particularly, to a pixel structure of an electroluminescent display panel having a common organic light-emitting layer formed in two adjacent sub-pixel regions for displaying different primary color lights, and a fabrication method thereof.

2. Description of the Prior Art

Due to its self-luminous, high contrast ratio, compact size, and wide viewing angle properties, electroluminescent display panel e.g. organic light-emitting diode (OLED) display panel has been expected to prevail in the display market of next generation. The organic light-emitting layer used in a conventional electroluminescent display panel is formed through an evaporation process by using a fine metal mask (FMM). However, there exists a distance limitation between the adjacent openings of the fine metal mask, and there has to be disposed certain spacing between adjacent sub-pixel regions of different colors in order to avoid light mixing between adjacent sub-pixel regions that generate different colors of light. Therefore, it is hard to further improve the aperture ratio and resolution of a conventional electroluminescent display panel.

SUMMARY OF THE INVENTION

It is therefore one of the objectives of the present invention to provide a pixel structure of an electroluminescent display panel for avoiding light-mixing problem occurred between adjacent sub-pixel regions with different colors and for raising the aperture ratio and resolution.

According to a preferred embodiment of the present invention, a pixel structure of an electroluminescent display panel having a first sub-pixel region, a second sub-pixel region, and a third sub-pixel region is provided. The pixel structure of the electroluminescent display panel includes a first anode, a second anode, a third anode, a first organic light-emitting layer, a second organic light-emitting layer, a first cathode, a second cathode, and a third cathode. The first anode is disposed in the first sub-pixel region, the second anode is disposed in the second sub-pixel region, and the third anode is disposed in the third sub-pixel region. The first organic light-emitting layer is disposed on the first anode and corresponds to the first sub-pixel region, wherein the first organic light-emitting layer comprises a first organic light-emitting material for generating a first primary color light in the first sub-pixel region. The second organic light-emitting layer is disposed on the second anode and the third anode, and corresponds to the second sub-pixel region and third sub-pixel region, wherein the second organic light-emitting layer is used for generating a second primary color light in the second sub-pixel region and generating a third primary color light in the third sub-pixel region, and the first primary color light, the second primary color light, and the third primary color light have different spectra of wavelength. The first cathode is disposed on the first organic light-emitting layer and corresponds to the first sub-pixel region. The second cathode is disposed on the second organic light-emitting layer and corresponds to the second sub-pixel region. The third cathode is disposed on the second organic light-emitting layer and corresponds to the third sub-pixel region. A first micro cavity is formed between the first anode and the first cathode in the first sub-pixel region. A second micro cavity is formed between the second anode and the second cathode in the second sub-pixel region. A third micro cavity is formed between the third anode and the third cathode in the third sub-pixel region. The first micro cavity, the second micro cavity, and the third micro cavity have different cavity lengths.

According to another preferred embodiment of the present invention, a fabrication method of a pixel structure of an electroluminescent display panel is provided. The fabrication method includes: providing a substrate, and defining a first sub-pixel region, a second sub-pixel region, and a third sub-pixel region on the substrate; respectively forming a first anode, a second anode, and a third anode in the first sub-pixel region, the second sub-pixel region, and the third sub-pixel region of the substrate; forming a first organic light-emitting layer in the first sub-pixel region by using a first fine metal mask, wherein the first organic light-emitting layer includes a first organic light-emitting material; forming a second organic light-emitting layer in the second sub-pixel region and the third sub-pixel region by using a second fine metal mask; and respectively forming a first cathode, a second cathode, and a third cathode in the first sub-pixel region, the second sub-pixel region, and the third sub-pixel region of the substrate. Wherein, a first micro cavity is formed between the first anode and the first cathode in the first sub-pixel region, a second micro cavity is formed between the second anode and the second cathode in the second sub-pixel region, and a third micro cavity is formed between the third anode and the third cathode in the third sub-pixel region. The first micro cavity, the second micro cavity, and the third micro cavity have different cavity lengths.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate the contents and effects to be achieved.

Figure 1:
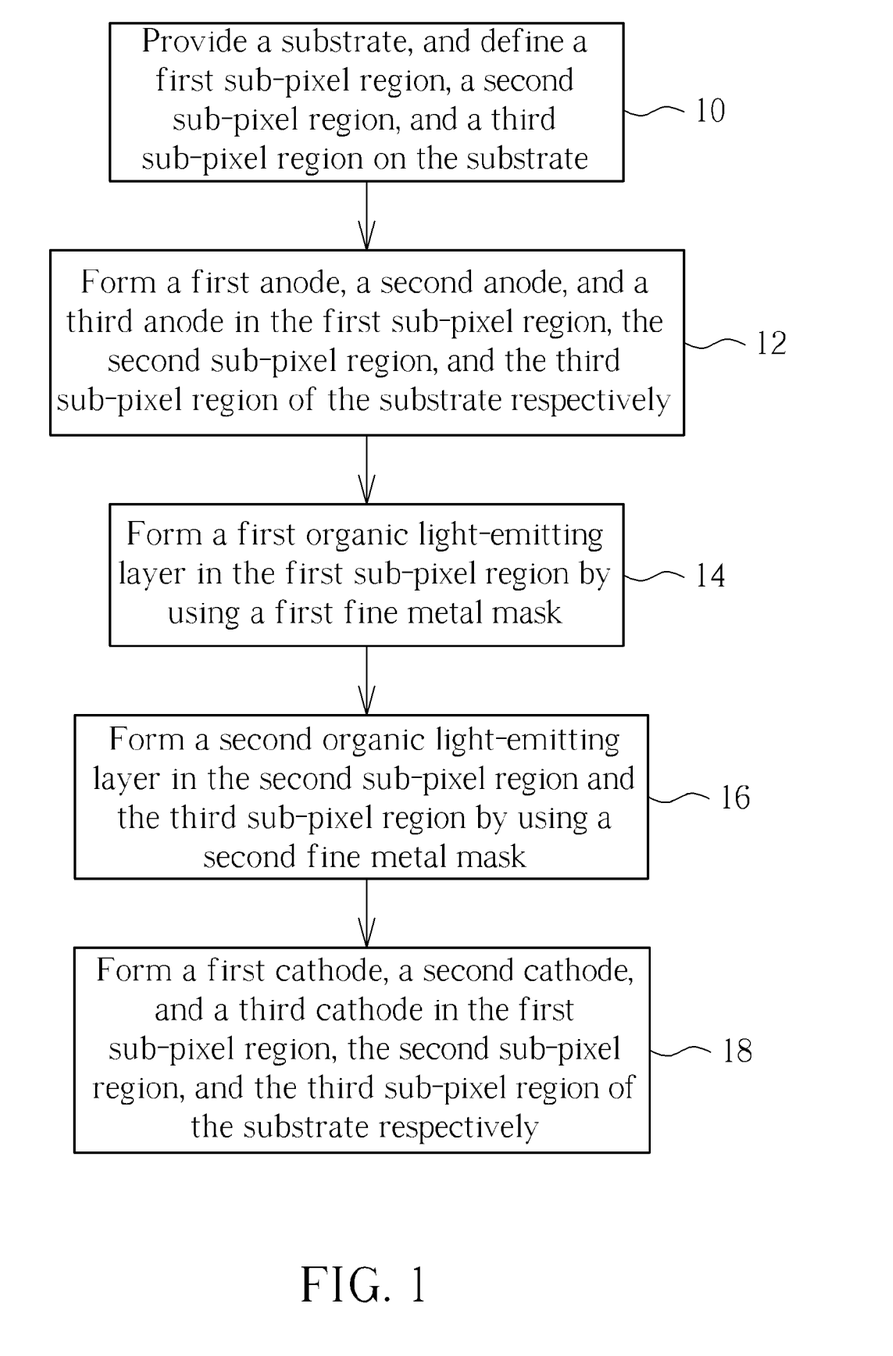
FIG. 1 is a process flow diagram of a fabrication method of a pixel structure of an electroluminescent display panel according to the present invention.

With reference to FIG. 1, FIG. 1 is a process flow diagram of a fabrication method of a pixel structure of an electroluminescent display panel of the present invention. As shown in FIG. 1, the fabrication method of a pixel structure of an electroluminescent display panel of the present invention mainly includes the following steps:

Step 10: Provide a substrate, and define a first sub-pixel region, a second sub-pixel region, and a third sub-pixel region on the substrate;

Step 12: Respectively form a first anode, a second anode, and a third anode in the first sub-pixel region, the second sub-pixel region, and the third sub-pixel region of the substrate;

Step 14: Form a first organic light-emitting layer in the first sub-pixel region by using a first fine metal mask;

Step 16: Form a second organic light-emitting layer in the second sub-pixel region and the third sub-pixel region by using a second fine metal mask; and Step 18: Respectively form a first cathode, a second cathode, and a third cathode in the first sub-pixel region, the second sub-pixel region, and the third sub-pixel region of the substrate.

Accordingly to the fabrication method of a pixel structure of an electroluminescent display panel of the present invention, the first organic light-emitting layer is evaporated into the first sub-pixel region by using the first fine metal mask, for generating a first primary color light in the first sub-pixel region, and the second organic light-emitting layer is evaporated into the second sub-pixel region and the third sub-pixel region at the same time by using the second fine metal mask, for generating a second primary color light in the second sub-pixel region and generating a third primary color light in the third sub-pixel region. Therefore, the amount of fine metal masks needed and fabrication cost of the fabrication method of a pixel structure of an electroluminescent display panel of the present invention are reduced. Also, the aperture ratio and resolution can be increased. A detailed description of different embodiments of a pixel structure of an electroluminescent display panel of the present invention and the fabrication method thereof is provided in the following descriptions.

Figure 2:
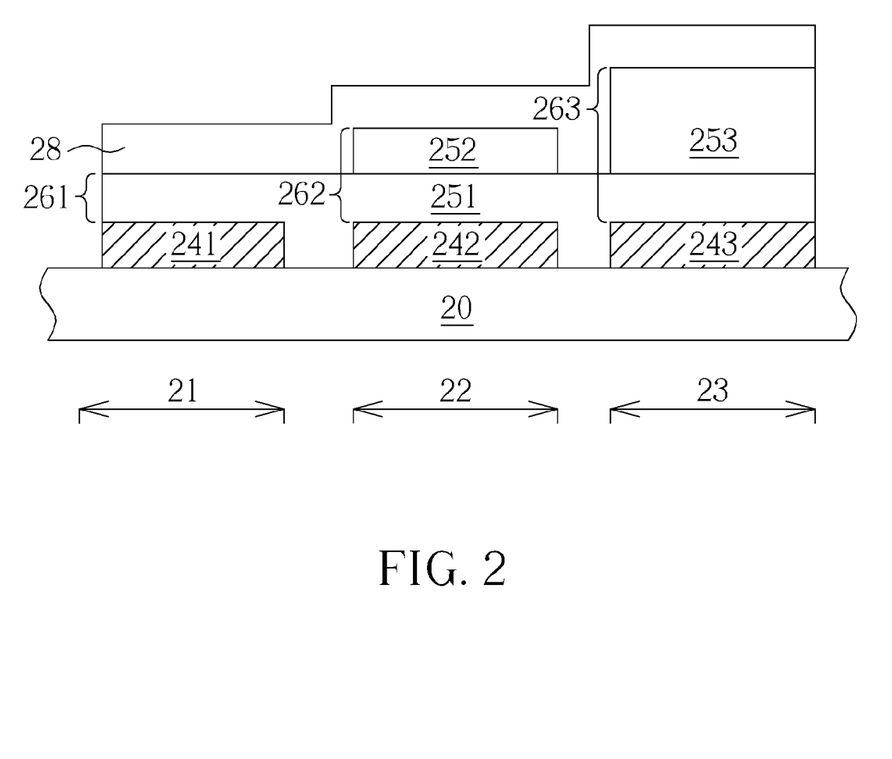
FIG. 2 to FIG. 4 are schematic diagrams illustrating a fabrication method of a pixel structure of an electroluminescent display panel according to a first preferred embodiment of the present invention.
Figure 3:
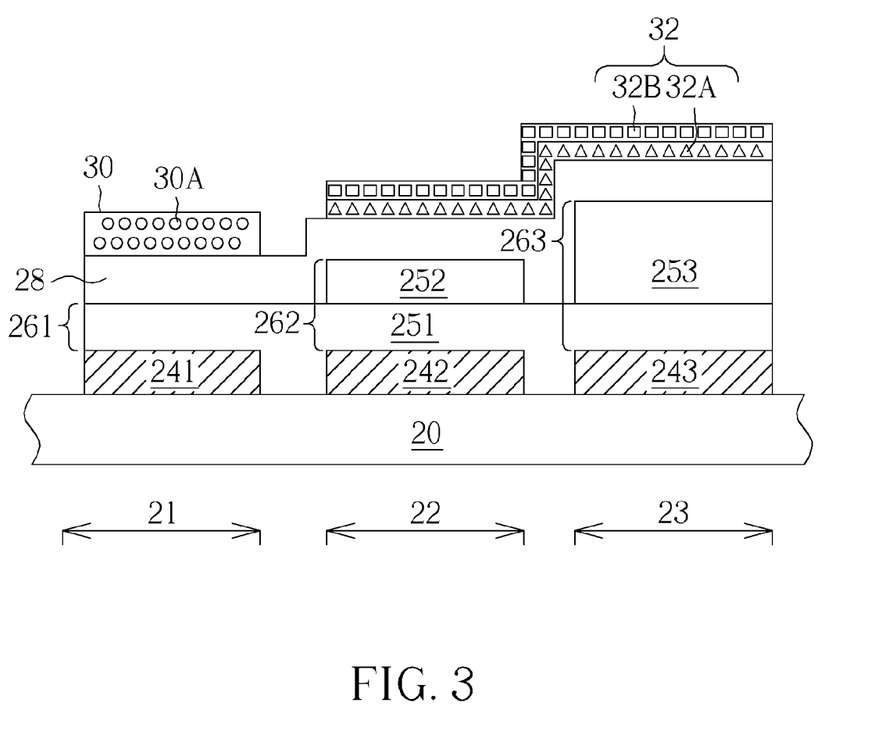
Figure 4:
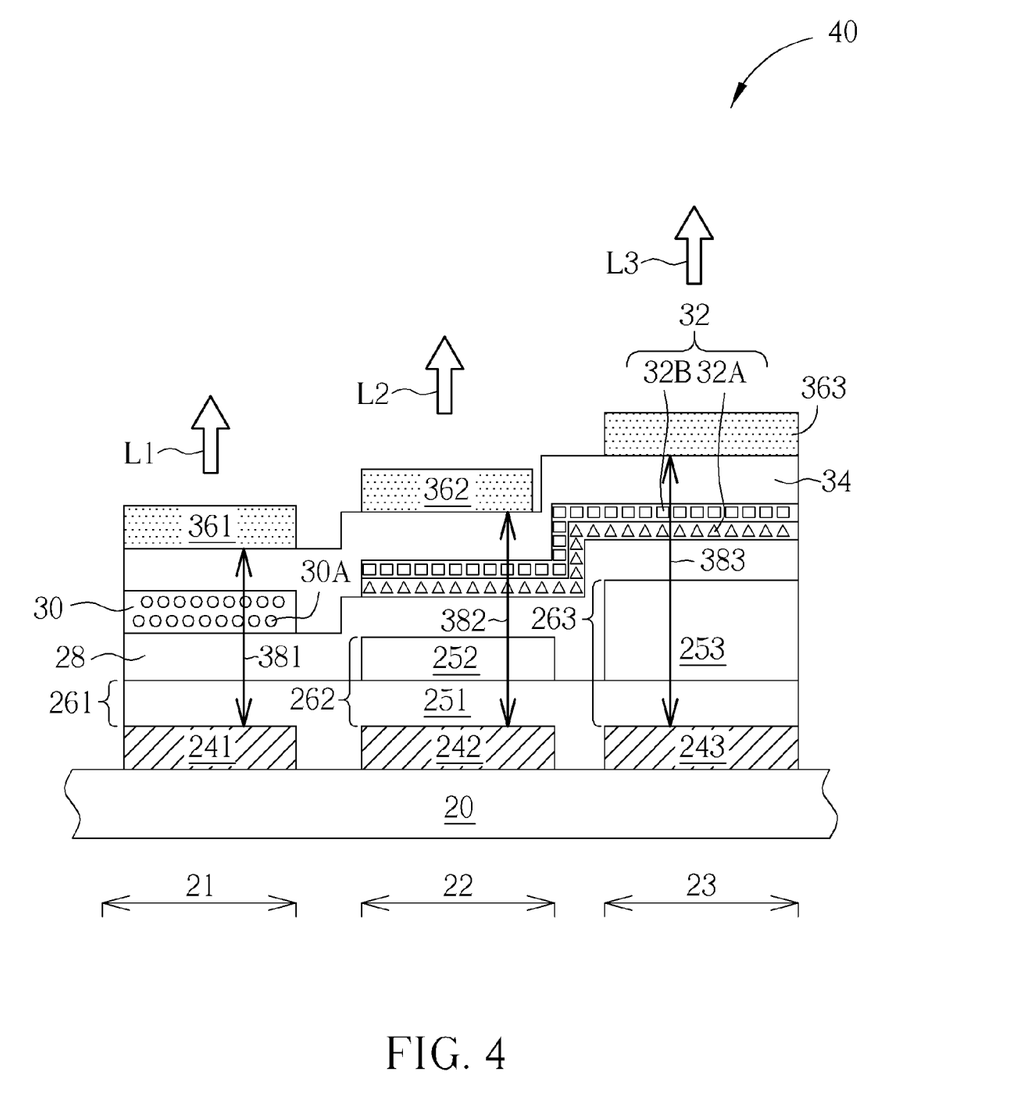

Please refer to FIG. 2 to FIG. 4. FIG. 2 to FIG. 4 are schematic diagrams illustrating the fabrication method of a pixel structure of an electroluminescent display panel according to a first preferred embodiment of the present invention. As shown in FIG. 2, first, a substrate 20 is provided, which has a first sub-pixel region 21, a second sub-pixel region 22, and a third sub-pixel region 23 for individually displaying different primary color lights. Then, a first anode 241, a second anode 242, and a third anode 243 are formed in the first sub-pixel region 21, the second sub-pixel region 22, and third sub-pixel region 23 of the substrate 20 respectively. The first anode 241, the second anode 242, and the third anode 243 can be formed through, but not limited to, an evaporation process in collocation with a fine metal mask (FMM). In another variant embodiment, the first anode 241, the second anode 242, and the third anode 243 can also be formed through a chemical vapor deposition process and a photolithography-etching-process (PEP) for example. According to this embodiment, the electroluminescent display panel may be a top emission type electroluminescent display panel. Therefore, the first anode 241, the second anode 242, and the third anode 243 may be reflective electrodes, such as thick metal electrodes, but not limited thereto. When the electroluminescent display panel is a bottom emission type electroluminescent display panel, the first anode 241, the second anode 242, and the third anode 243 may be transflective electrodes, such as thin metal electrodes. Then, at least a first hole injection layer 261 is formed in the first sub-pixel region 21, at least a second hole injection layer 262 is formed in the second sub-pixel region 22, and at least a third hole injection layer 263 is formed in the third sub-pixel region 23; wherein the first hole injection layer 261, the second hole injection layer 262, and the third hole injection layer 263 have different thicknesses. In this embodiment, the formation of the first hole injection layer 261, the second hole injection layer 262, and the third hole injection layer 263 includes the following processes: at first, blanket forming a hole injection layer 251 in the first sub-pixel region 21, the second sub-pixel region 22, and the third sub-pixel region 23; and then respectively forming a first patterned hole injection layer 252 on the hole injection layer 251 of the second sub-pixel region 22 and forming a second patterned hole injection layer 253 on the hole injection layer 251 of the third sub-pixel region 23; wherein the thickness of the second patterned hole injection layer 253 is greater than the thickness of the first patterned hole injection layer 252. The first patterned hole injection layer 252 and the second patterned hole injection layer 253 can be individually formed through, but not limited to, an evaporation in collocation with a fine metal mask for example. By means of the above-mentioned processes, the hole injection layer 251 forms a first hole injection layer 261 in the first sub-pixel region 21, the hole injection layer 251 and the first patterned hole injection layer 252 stacked thereon form a second hole injection layer 262 in the second sub-pixel region 22, and the hole injection layer 251 and the second patterned hole injection layer 253 stacked thereon form a third hole injection layer 263 in the third sub-pixel region 23. Wherein, the thickness of the first hole injection layer 261 is less than the thickness of the second hole injection layer 262, and the thickness of the second hole injection layer 262 is less than the thickness of the third hole injection layer 263. After that, a hole transmission layer 28 is formed on the first hole injection layer 261, the second hole injection layer 262, and the third hole injection layer 263.

As shown in FIG. 3, a first fine metal mask is used to form a first organic light-emitting layer 30 in the first sub-pixel region 21, and a second fine metal mask is used to form a second organic light-emitting layer 32 in the second sub-pixel region 22 and the third sub-pixel region 23. The first organic light-emitting layer 30 includes a first organic light-emitting material 30A, and the second organic light-emitting layer 32 includes a second organic light-emitting material 32A and a third organic light-emitting material 32B. The first organic light-emitting material 30A is a blue light-emitting material. The second organic light-emitting material 32A and the third organic light-emitting material 32B can be respectively selected from one of a red light-emitting material and a green light-emitting material, and there is no limitation of the stacking order of the red light-emitting material and the green light-emitting material. The first organic light-emitting layer 30 and the second organic light-emitting layer 32 may be formed through an evaporation process respectively, but not limited thereto. In this embodiment, the second organic light-emitting layer 32 is a composite organic light-emitting layer, and the formation of the second organic light-emitting layer 32 may include the following processes: performing an evaporation process by using a second fine metal mask to form the second organic light-emitting material 32A in the second sub-pixel region 22 and the third sub-pixel region 23; and performing another evaporation process by using the same second fine metal mask to form the third organic light-emitting material 32B in the second sub-pixel region 22 and the third sub-pixel region 23.

As shown in FIG. 4, an electron transmission layer 34 is formed on the first organic light-emitting layer 30 and the second organic light-emitting layer 32. Then, a first cathode 361, a second cathode 362, and a third cathode 363 are respectively formed in the first sub-pixel region 21, the second sub-pixel region 22, and the third sub-pixel region 23 of the substrate 20 to complete the fabrication of the pixel structure of an electroluminescent display panel 40 of this embodiment. The electroluminescent display panel of this embodiment is a top emission type electroluminescent display panel, so that the first cathode 361, the second cathode 362, and the third cathode 363 may be transflective electrodes, such as thin film metal electrodes, but not limited thereto. When the electroluminescent display panel is a bottom emission type electroluminescent display panel, the first cathode 361, the second cathode 362, and the third cathode 363 may be reflective electrodes, such as thick metal electrodes. The first cathode 361, the second cathode 362, and the third cathode 363 may be electrically connected to each other and be driven by being applied with a common voltage. Alternatively, the first cathode 361, the second cathode 362, and the third cathode 363 may be electrically separated and applied with different voltages. In the first sub-pixel region 21, a first micro cavity 381 is formed between the first anode 241 and the first cathode 361; in the second sub-pixel region 22, a second micro cavity 382 is formed between the second anode 242 and the second cathode 362; and in the third sub-pixel region 23, a third micro cavity 383 is formed between the third anode 243 and the third cathode 363. Since the first hole injection layer 261, the second hole injection layer 262, and the third hole injection layer 263 have different thickness, the first micro cavity 381, the second micro cavity 382, and the third micro cavity 383 have different cavity lengths, resulting in that a first primary color light L1, a second primary color light L2, and a third primary color light L3 can be generated in the first sub-pixel region 21, the second sub-pixel region 22, and the third sub-pixel region 23 respectively. In this embodiment, the thickness of the first hole injection layer 261 is less than the thickness of the second hole injection layer 262 and the thickness of the second hole injection layer 262 is less than the thickness of the third hole injection layer 263, such that the cavity length of the first micro cavity 381 is less than the cavity length of the second micro cavity 382 and the cavity length of the second micro cavity 382 is less than the cavity length of the third micro cavity 383. The cavity lengths of the first micro cavity 381, the second micro cavity 382, and the third micro cavity 383 may be modified to be different based on the spectra of wavelength of the first primary color light L1, the second primary color light L2, and the third primary color light L3. Specifically, the greater the wavelength is, the greater the cavity length is. When displaying, due to micro cavity effect, the first primary color light (blue light) L1 generated by the first organic light-emitting layer 30 can emit out from the first sub-pixel region 21, the second primary color light (green light) L2 generated by the second organic light-emitting layer 32 can emit out from the second sub-pixel region 22 but cannot emit out from the third sub-pixel region 23, and the third primary color light (red light) L3 generated by the second organic light-emitting layer 32 can emitted out from the third sub-pixel region 23 but cannot emit out from the second sub-pixel region 22. As a result, the total amount of the fine metal masks used in the fabrication method of the pixel structure of an electroluminescent display panel of this embodiment can be reduced and the light-mixing ratio is lowered. Furthermore, a high aperture ratio and high resolution of the pixel structure of the electroluminescent display panel 40 can be preserved. In addition, due to micro cavity, the first primary color light L1, the second primary color light L2, and the third primary color light L3 generated in the pixel structure of the electroluminescent display panel 40 have distinct spectra of wavelength so that the color purity and color saturation can be improved, wherein no color filter is needed in the pixel structure. Furthermore, the pixel structure of the electroluminescent display panel 40 of this embodiment may at least comprise a first sub-pixel region 21, a second sub-pixel region 22, and a third sub-pixel region 23, or may consist of a first sub-pixel region 21, a second sub-pixel region 22, and a third sub-pixel region 23.

The pixel structure of the electroluminescent display panel of the present invention and the fabrication method thereof are not limited by the aforementioned embodiment, and may have other different preferred embodiments and variant embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 5:
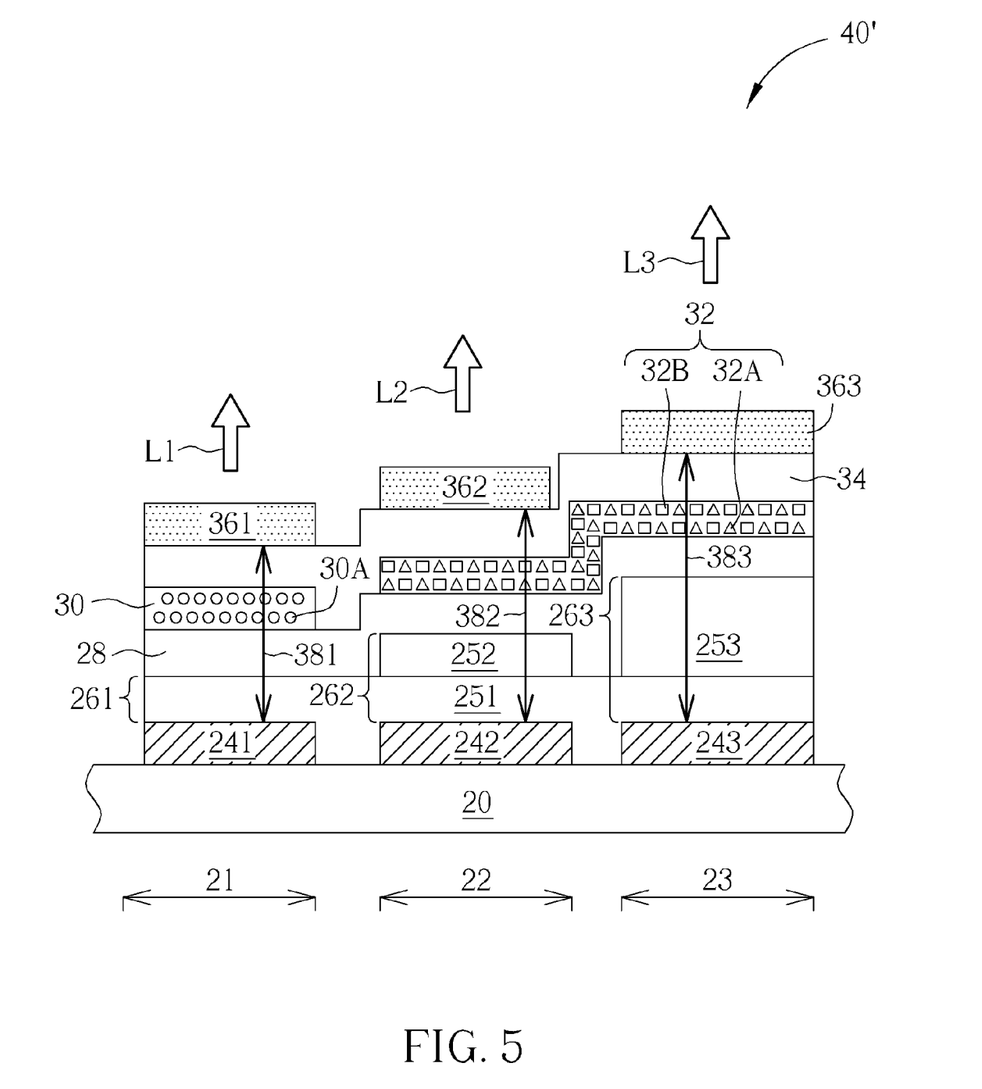
FIG. 5 is a schematic diagram illustrating a pixel structure of an electroluminescent display panel according to a variant embodiment of the first preferred embodiment of the present invention.

Please refer to FIG. 5. FIG. 5 is a schematic diagram of a variant embodiment of the first preferred embodiment of the pixel structure of the electroluminescent display panel of the present invention. As shown in FIG. 5, in this variant embodiment, the second organic light-emitting layer 32 of the pixel structure of the electroluminescent display panel 40' is a single-layered organic light-emitting layer, not the same as the first preferred embodiment. Furthermore, the formation of the second organic light-emitting layer 32 includes performing an evaporation process by using a second fine metal mask to simultaneously evaporate the second organic light-emitting material 32A and the third organic light-emitting material 32B onto the second sub-pixel region 22 and the third sub-pixel region 23. In another variant embodiment, the second organic light-emitting layer 32 may include only one single light-emitting material. In that case, for instance, when the first organic light-emitting material 30A is a blue light-emitting material, the second organic light-emitting layer 32 is a yellow light-emitting material.

Figure 6:
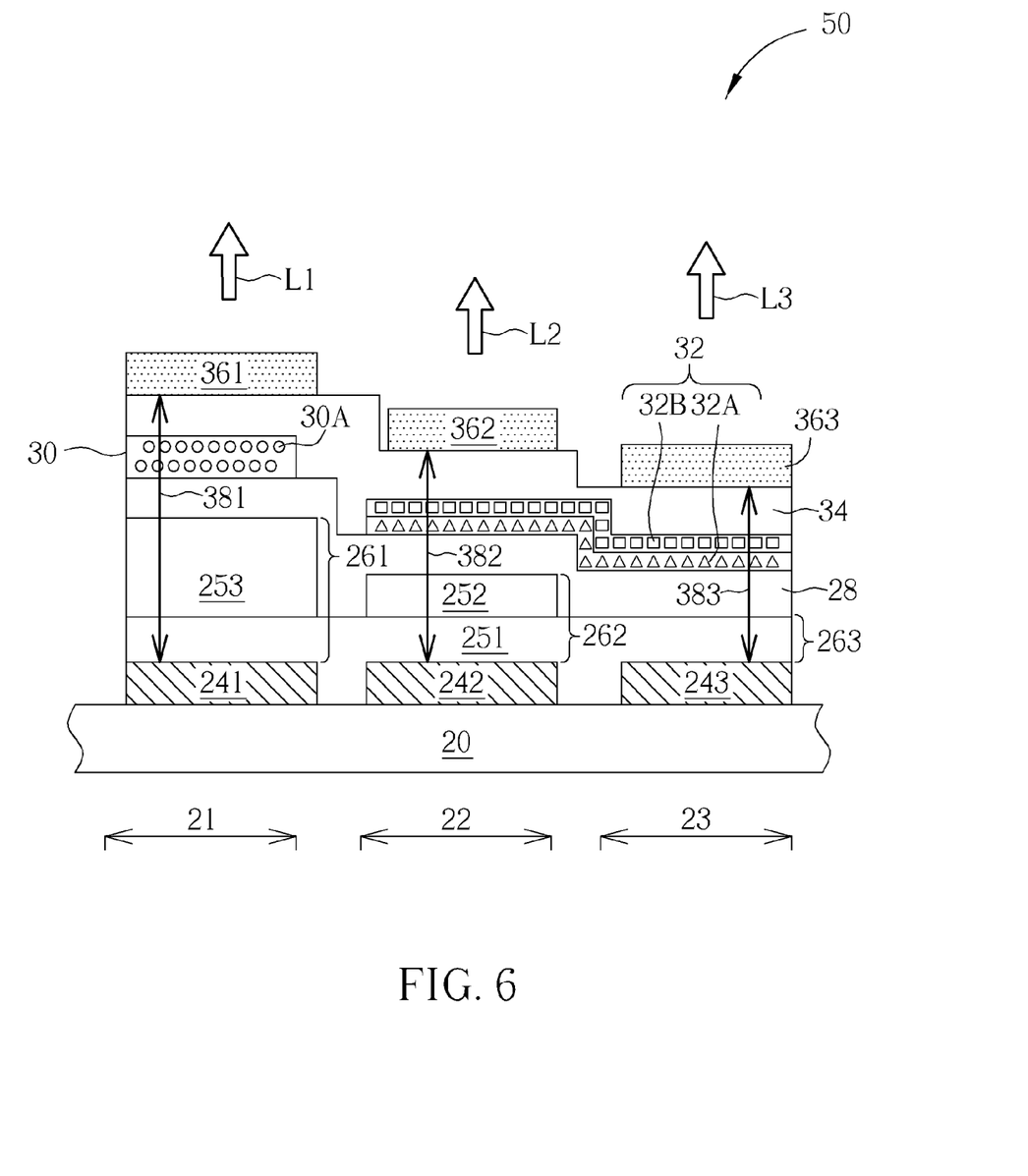
FIG. 6 is a schematic diagram illustrating a pixel structure of the electroluminescent display panel according to a second preferred embodiment of the present invention.

With reference to FIG. 6, FIG. 6 is a schematic diagram of a pixel structure of the electroluminescent display panel according to a second preferred embodiment of the present invention. As shown in FIG. 6, in the pixel structure of the electroluminescent display panel 50 of this embodiment, the first organic light-emitting material 30A is a red light-emitting material, the second organic light-emitting material 32A and the third organic light-emitting material 32B may be individually selected from one of a blue light-emitting material and a green light-emitting material, wherein the stacking order of the blue light-emitting material and the green light-emitting material is not limited. In addition, the hole injection layer 251 is disposed in the first sub-pixel region 21, the second sub-pixel region 22, and the third sub-pixel region 23.

The first patterned hole injection layer 252 is disposed in the second sub-pixel region 22, and the second patterned hole injection layer 253 is disposed in the first sub-pixel region 21, wherein the thickness of the second patterned hole injection layer 253 is greater than the thickness of the first patterned hole injection layer 252. As a result, in the first sub-pixel region 21, the hole injection layer 251 and the second patterned hole injection layer 253 stacked thereon form a first hole injection layer 261; in the second sub-pixel region 22, the hole injection layer 251 and the first patterned hole injection layer 252 stacked thereon form a second hole injection layer 262; and in the third sub-pixel region 23, the hole injection layer 251 form a third hole injection layer 263; wherein the thickness of the first hole injection layer 261 is greater than the thickness of the second hole injection layer 262, and the thickness of the second hole injection layer 262 is greater than the thickness of the third hole injection layer 263. As a result, the cavity length of the first micro cavity 381 is greater than the cavity length of the second micro cavity 382, and the cavity length of the second micro cavity 382 is greater than the cavity length of the third micro cavity 383. Due to micro cavity, the first primary color light (red light) L1 generated by the first organic light-emitting layer 30 can emit out from the first sub-pixel region 21, the second primary color light (green light) L2 of the second organic light-emitting layer 32 can emit out from the second sub-pixel region 22 but cannot emit out from the third sub-pixel region 23, and the third primary color light (blue light) L3 generated by the second organic light-emitting layer 32 can emit out from the third sub-pixel region 23 but cannot emit out from the second sub-pixel region 22. In one variant embodiment of this embodiment, the second organic light-emitting layer 32 may be a single-layered organic light-emitting layer, and the second organic light-emitting layer 32 may be formed though a co-evaporation process. In another variant embodiment, the second organic light-emitting layer 32 may also include only one single light-emitting material. For example, the first organic light-emitting material 30A may be a red light-emitting material, and the second organic light-emitting layer 32 may by a cyan light-emitting material.

Figure 7:
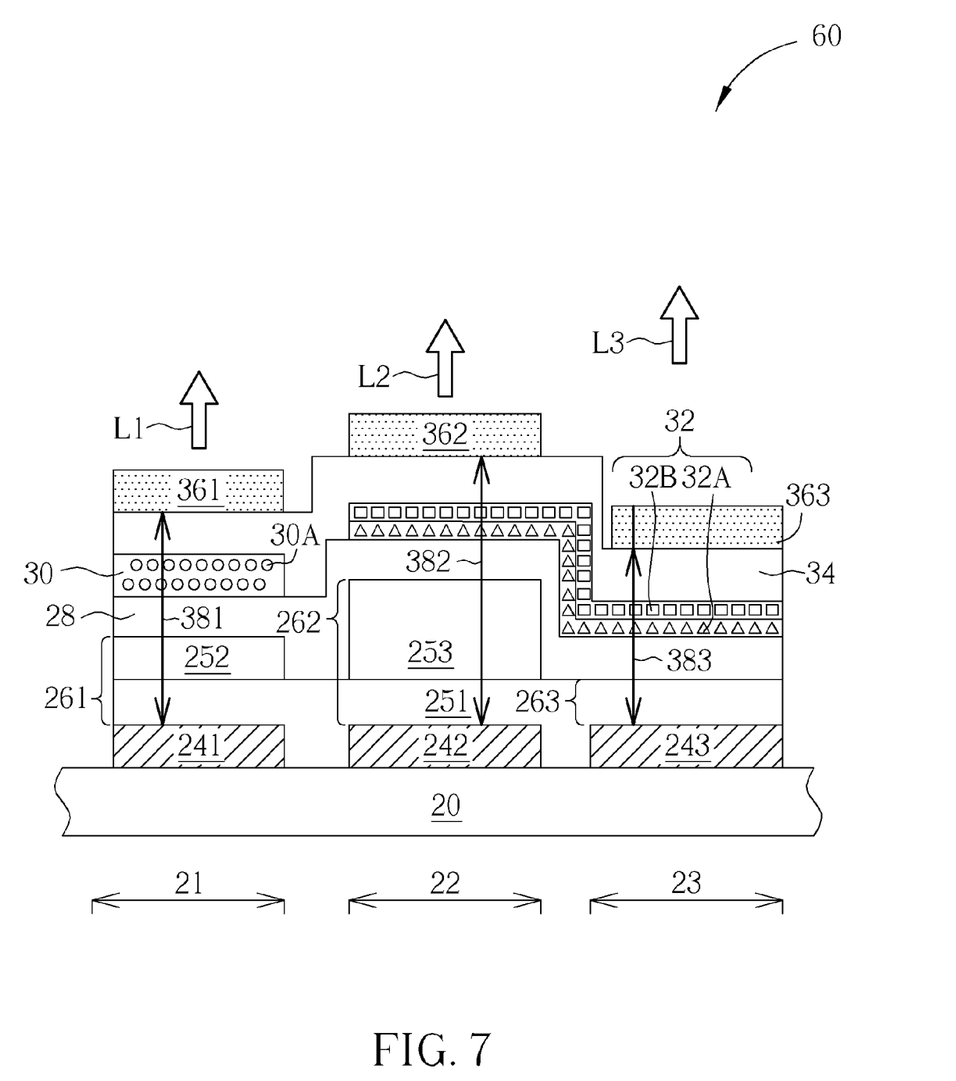
FIG. 7 is a schematic diagram illustrating a pixel structure of an electroluminescent display panel according to a third preferred embodiment of the present invention.

With reference to FIG. 7, FIG. 7 is a schematic diagram illustrating a pixel structure of an electroluminescent display panel according to a third preferred embodiment of the present invention. As shown in FIG. 7, in the pixel structure of the electroluminescent display panel 60 of this embodiment, the first organic light-emitting material 30A may further be a green light-emitting material, and the second organic light-emitting material 32A and the third organic light-emitting material 32B may be selected form one of a red light-emitting material and a blue light-emitting material, wherein the stacking order of the red light-emitting material and the blue light-emitting material is not limited. In addition, the hole injection layer 251 is disposed in the first sub-pixel region 21, the second sub-pixel region 22, and the third sub-pixel region 23. The first patterned hole injection layer 252 is disposed in the first sub-pixel region 21 and the second patterned hole injection layer 253 is disposed in the second sub-pixel region 22, wherein thickness of the second patterned hole injection layer 253 is greater than the thickness of the first patterned hole injection layer 252. As a result, the hole injection layer 251 and the first patterned hole injection layer 252 stacked thereon form a first hole injection layer 261 in the first sub-pixel region 21, the hole injection layer 251 and the second patterned hole injection layer 253 stacked thereon form a second hole injection layer 262 in the second sub-pixel region 22, and the hole injection layer 251 form a third hole injection layer 263 in the third sub-pixel region 23. Wherein, the thickness of the second hole injection layer 262 is greater than the thickness of the first hole injection layer 261, and the thickness of the first hole injection layer 261 is greater than the thickness of the third hole injection layer 263. As a result, the cavity length of the second micro cavity 382 is greater than the cavity length of the first micro cavity 381, and the cavity length of the first micro cavity 381 is greater than the cavity length of the third micro cavity 383. Due to micro cavity effect, the first primary color light (green light) L1 generated by the first organic light-emitting layer 30 can emit out from the first sub-pixel region 21, the second primary color light (red light) L2 generated by the second organic light-emitting layer 32 can emit out from the second sub-pixel region 22 but cannot emit out from the third sub-pixel region 23, and the third primary color light (blue light) L3 generated by the second organic light-emitting layer 32 can emit out from the third sub-pixel region 23 but cannot emit out from the second sub-pixel region 22. In a variant embodiment of this embodiment, the second organic light-emitting layer 32 may be a single-layered organic light-emitting layer, which may be formed through a co-evaporation process.

Figure 8:
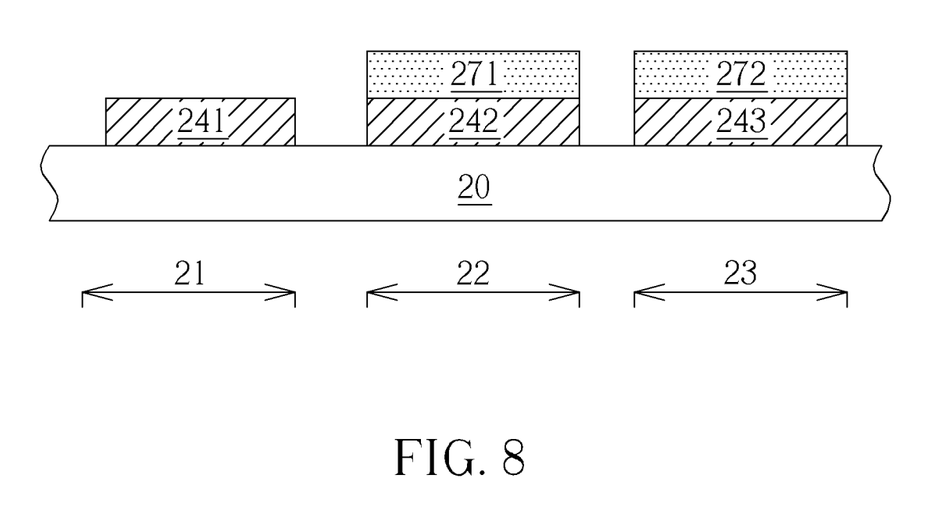
FIG. 8 to FIG. 10 are schematic diagrams illustrating a fabrication method of a pixel structure of an electroluminescent display panel according to a fourth preferred embodiment of the present invention.
Figure 9:
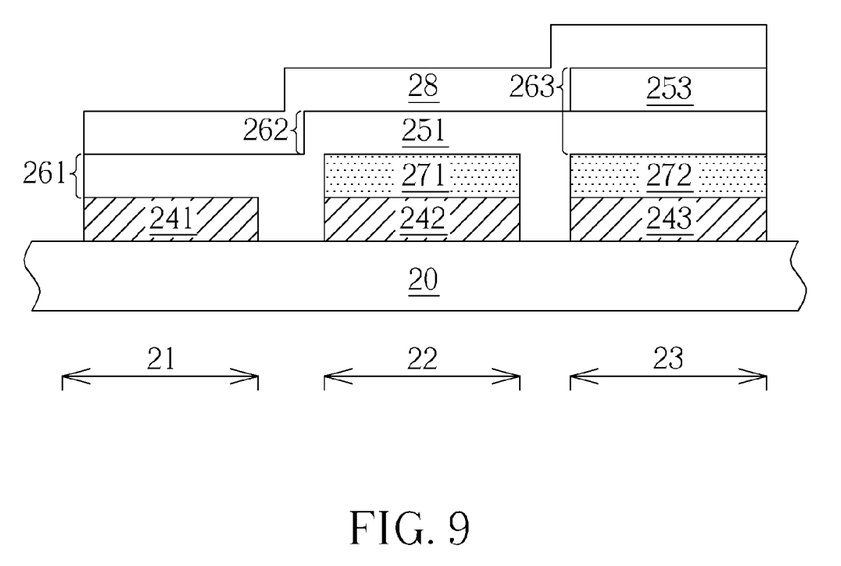
Figure 10:
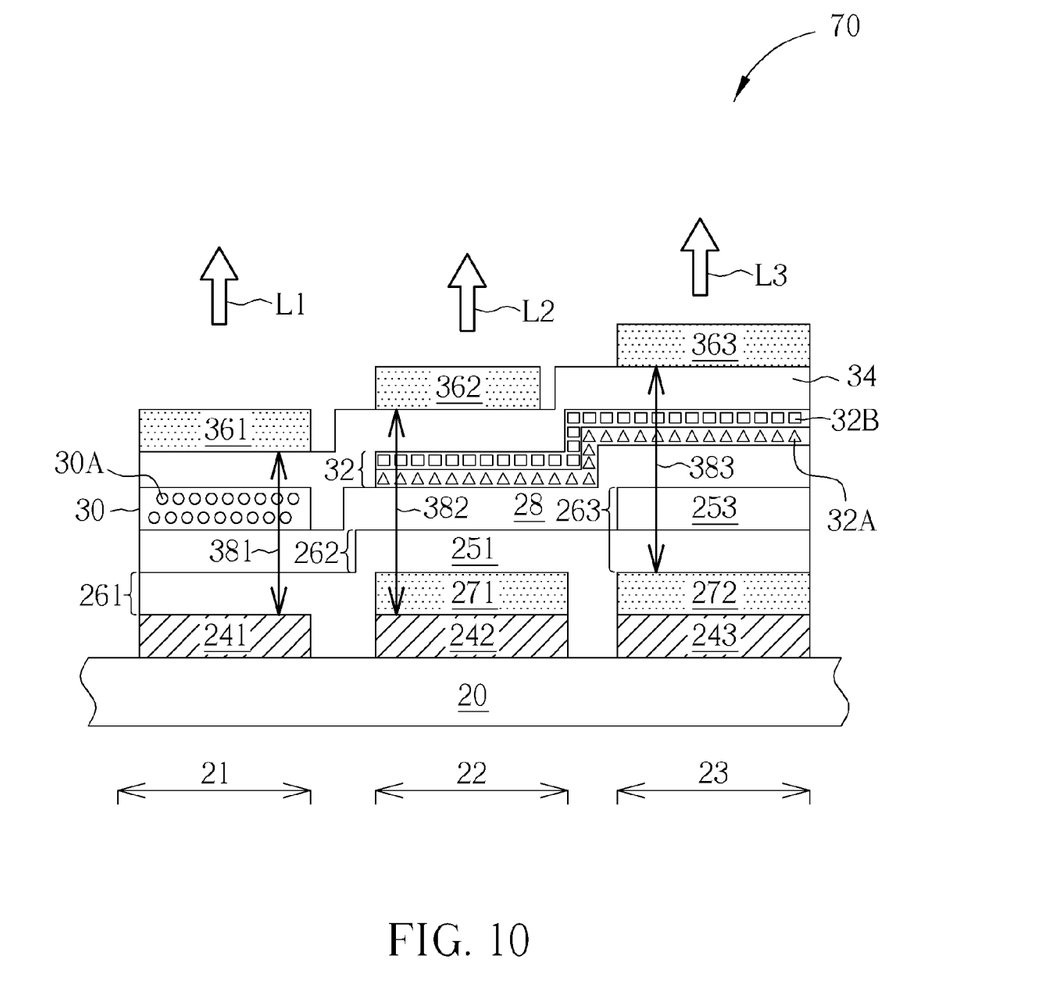

Please refer to FIG. 8 to FIG. 10. FIG. 8 to FIG. 10 are schematic diagrams illustrating the fabrication method of a pixel structure of an electroluminescent display panel according to a fourth preferred embodiment of the present invention. First, a substrate 20 is provided, and a first sub-pixel region 21, a second sub-pixel region 22, and a third sub-pixel region 23 are defined on the substrate 20. Then, a first anode 241, a second anode 242, and a third anode 243 are respectively formed in the first sub-pixel region 21, the second sub-pixel region 22, and the third sub-pixel region 23 of the substrate 20. Sequentially, a first transparent electrode layer 271 is formed on the second anode 242 and a second transparent electrode layer 272 is formed on the third anode 243. The formation of the first transparent electrode layer 271 and the second transparent electrode layer 272 may include forming a transparent conductive layer (not shown), such as an indium tin oxide (ITO) layer, and then performing a PEP, but not limited thereto.

As shown in FIG. 9, then, at least a first hole injection layer 261, at least a second hole injection layer 262, and at least a third hole injection layer 263 are formed in the first sub-pixel region 21, the second sub-pixel region 22, and the third sub-pixel region 23 respectively. In this embodiment, the formation of the first hole injection layer 261, the second hole injection layer 262, and the third hole injection layer 263 includes the following processes. First, a hole injection layer 251 is blanket formed in the first sub-pixel region 21, the second sub-pixel region 22, and the third sub-pixel region 23. Then, a second patterned hole injection layer 253 is formed on the hole injection layer 251 of the third sub-pixel region 23. The second patterned hole injection layer 253 may be formed through, but not limited to, an evaporation process in collocation with a fine metal mask. Based on the abovementioned processes, the hole injection layer 251 forms a first hole injection layer 261 in the first sub-pixel region 21, the hole injection layer 251 forms a second hole injection layer 262 in the second sub-pixel region 22, and the hole injection layer 251 and the second patterned hole injection layer 253 stacked thereon form a third hole injection layer 263 in the third sub-pixel region 23. Wherein, the thickness of the first hole injection layer 261 is the same as the thickness of the second hole injection layer 262, and the thickness of the second hole injection layer 262 is less than the thickness of the third hole injection layer 263. Sequentially, a hole transmission layer 28 is formed on the first hole injection layer 261, the second hole injection layer 262, and the third hole injection layer 263.

As shown in FIG. 10, then a first fine metal mask is sued to form a first organic light-emitting layer 30 in the first sub-pixel region 21, and a second fine metal mask is used to form a second organic light-emitting layer 32 in the second sub-pixel region 22 and the third sub-pixel region 23. The first organic light-emitting layer 30 includes a first organic light-emitting material 30A, and the second organic light-emitting layer 32 includes a second organic light-emitting material 32A and a third organic light-emitting material 32B. The first organic light-emitting layer 30 and the second organic light-emitting layer 32 may be formed through an evaporation process respectively, but not limited thereto. In this embodiment, the second organic light-emitting layer 32 is a composite-layered organic light-emitting layer, and the formation processes of the second organic light-emitting layer 32 may be similar to those processes illustrated in the aforementioned embodiments. Furthermore, the second organic light-emitting layer 32 may be a single-layered organic light-emitting layer, and the formation of the second organic light-emitting layer 32 may include the processes in the aforementioned embodiments. Then, an electron transmission layer 34 is formed on the first organic light-emitting layer 30 and the second organic light-emitting layer 32. Sequentially, a first cathode 361, a second cathode 362, and a third cathode 363 are respectively formed in the first sub-pixel region 21, the second sub-pixel region 22, and the third sub-pixel region 23 of the substrate 20 to complete the fabrication of the pixel structure of the electroluminescent display panel 70 of this embodiment. In this embodiment, because of the disposition of the first transparent electrode layer 271, the second transparent electrode layer 272, and the second patterned hole injection layer 253, the first micro cavity 381, the second micro cavity 382, and the third micro cavity 383 have different cavity lengths. To be precise, in this embodiment, the first organic light-emitting material is a blue light-emitting material, the second organic light-emitting material is a green light-emitting material, and the third organic light-emitting material is a red light-emitting material. Therefore, the cavity length of the first micro cavity 381 is less than the cavity length of the second micro cavity 382, and the cavity length of the second micro cavity 382 is less than the cavity length of the third micro cavity 383, resulting that a first primary color light (blue light) L1, a second primary color light (green light) L2, and a third primary color light (red light) L3 are respectively generated in the first sub-pixel region 21, the second sub-pixel region 22, and the third sub-pixel region 23.

From the above description, according to the present invention, three different primary color lights can be displayed by using only two layers of organic light-emitting layers through modifying the cavity lengths of the micro cavities, wherein the theory of modifying the cavity lengths of micro cavities can be practiced by rendering the thickness of any one of the hole injection layer, the hole transmission layer, the electron transmission, and the electron injection layer in each sub-pixel region different thickness, or by disposing other film layers, such as transparent electrode layers, in some sub-pixel regions. Furthermore, the primary color lights generated by the first organic light-emitting layer, the second organic light-emitting layer, and the third organic light-emitting layer may be individually adjusted if needed, and are not limited to the aforementioned embodiments.

In conclusion, in the pixel structure of the electroluminescent display panel of the present invention, two adjacent sub-pixel regions for displaying different primary color lights share a common organic light-emitting layer, thus the whole fabrication process can be simplified and the aperture ratio and resolution can be increased. Furthermore, due to micro cavity effect, the pixel structure of the electroluminescent display panel of the present invention only requires two organic light-emitting layers to display a full-color image composed of three different primary lights.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabrication method of pixel structure of electroluminescent display panel, comprising:
   providing a substrate, and defining a first sub-pixel region, a second sub-pixel region, and a third sub-pixel region on the substrate;
   respectively forming a first anode, a second anode, and a third anode in the first sub-pixel region, the second sub-pixel region, and the third sub-pixel region of the substrate;
   forming a first organic light-emitting layer in the first sub-pixel region by using a first fine metal mask, wherein the first organic light-emitting layer comprises a first organic light-emitting material;
   forming a second organic light-emitting layer in the second sub-pixel region and the third sub-pixel region by using a second fine metal mask; and
   respectively forming a first cathode, a second cathode, and a third cathode in the first sub-pixel region, the second sub-pixel region, and the third sub-pixel region of the substrate;
   wherein a first micro cavity is formed between the first anode and the first cathode in the first sub-pixel region, a second micro cavity is formed between the second anode and the second cathode in the second sub-pixel region, and a third micro cavity is formed between the third anode and the third cathode in the third sub-pixel region, and the first micro cavity, the second micro cavity, and the third micro cavity have different cavity lengths.

2. The fabrication method of pixel structure of electroluminescent display panel of claim 1, wherein the second organic light-emitting layer comprises a second organic light-emitting material and a third organic light-emitting material.

3. The fabrication method of pixel structure of electroluminescent display panel of claim 2, wherein the second organic light-emitting layer is a composite-layered organic light-emitting layer, and a formation process of the second organic light-emitting layer comprises:
   performing an evaporation process by using the second fine metal mask to form the second organic light-emitting material in the second sub-pixel region and the third sub-pixel region; and
   performing another evaporation process by using the same second fine metal mask to form the third organic light-emitting material in the second sub-pixel region and the third sub-pixel region.

4. The fabrication method of pixel structure of electroluminescent display panel of claim 2, wherein the second organic light-emitting layer is a single-layered organic light-emitting layer, and a formation process of the second organic light-emitting layer comprises performing a co-evaporation process by using the second fine metal mask to form the second organic light-emitting material and the third organic light-emitting material in the second sub-pixel region and the third sub-pixel region simultaneously.

5. The fabrication method of pixel structure of electroluminescent display panel of claim 1, further comprising forming at least one first hole injection layer in the first sub-pixel region, forming at least one second hole injection layer in the second sub-pixel region, and forming at least one third hole injection layer the third sub-pixel region before forming the first organic light-emitting layer and the second organic light-emitting layer, wherein the at least one first hole injection layer, the at least one second hole injection layer, and the at least one third hole injection layer have different thicknesses to render the first micro cavity, the second micro cavity, and the third micro cavity different cavity lengths.

6. The fabrication method of pixel structure of electroluminescent display panel of claim 1, further comprising forming at least one first hole injection layer in the first sub-pixel region, forming at least one second hole injection layer in the second sub-pixel region, and forming at least one third hole injection layer in the third sub-pixel region before forming the first organic light-emitting layer and the second organic light-emitting layer, wherein one of the at least one first hole injection layer, the at least one second hole injection layer, and the at least one third hole injection layer has a different thickness from the thicknesses of the other two of the at least one first hole injection layer, the at least one second hole injection layer, and the at least one third hole injection layer, and one of the first anode, the second anode, and the third anode has a different thickness from the thicknesses of the other two of the first anode, the second anode, and the third anode to render the first micro cavity, the second micro cavity, and the third micro cavity different cavity lengths.

\* \* \* \* \*